(12) United States Patent
Scheiblhofer et al.

(10) Patent No.: US 7,768,862 B2
(45) Date of Patent: Aug. 3, 2010

(54) MEMORY ARRANGEMENT

(75) Inventors: Dietmar Scheiblhofer, Kaindorf (AT); Jurgen Jernej, Graz (AT)

(73) Assignee: Infineon Technologies AG, Neubiberg (DE)

( * ) Notice: Subject to any disclaimer, the term of this patent is extended or adjusted under 35 U.S.C. 154(b) by 722 days.

(21) Appl. No.: 11/240,816

(22) Filed: Sep. 30, 2005

(65) Prior Publication Data

US 2006/0067153 A1 Mar. 30, 2006

(30) Foreign Application Priority Data

Sep. 30, 2004 (DE) .................. 10 2004 047 764

(51) Int. Cl.
*G11C 5/14* (2006.01)
(52) U.S. Cl. .................. 365/226; 365/230.03
(58) Field of Classification Search .............. 365/227
See application file for complete search history.

(56) References Cited

U.S. PATENT DOCUMENTS 6,125,073 A * 9/2000 Le et al. .............. 365/230.03

| | | | |
|---|---|---|---|
| 6,195,306 B1 | 2/2001 | Horiguchi et al. | |
| 6,792,536 B1 * | 9/2004 | Teppler ................ | 713/178 |
| 2004/0085846 A1 | 5/2004 | Yokozeki et al. | |

FOREIGN PATENT DOCUMENTS

EP 0871178 10/1998

* cited by examiner

*Primary Examiner*—Hoai V Ho
*Assistant Examiner*—Jason Lappas
(74) *Attorney, Agent, or Firm*—Dickstein, Shapiro, LLP.

(57) ABSTRACT

A memory arrangement including a memory array, which has at least one memory block with a power supply device which can be activated, an address decoder, which is coupled to the at least one memory block in order to control access to the at least one memory block, and an activation device for selectively activating the power supply device of memory blocks. The address decoder is set up to interact with the activation device in such a manner that, when a memory block is accessed for the first time, the power supply device of the memory block is activated and remains activated after the access operation has ended.

7 Claims, 2 Drawing Sheets

MEMORY ARRANGEMENT

CROSS-REFERENCE TO RELATED APPLICATION

This application claims priority to German Patent Application Serial No. 102004047764.7, which was filed on Sep. 30, 2004 and is incorporated herein by reference in its entirety.

FIELD OF THE INVENTION

The invention relates to a memory arrangement having a memory array, which comprises at least one memory block having a power supply device which can be activated, an address decoder, which is coupled to the at least one memory block in order to control access to the at least one memory block, and an activation device for selectively activating the power supply device of memory blocks. In addition, the invention relates to a method for operating such a memory arrangement and to a use of such a memory arrangement.

BACKGROUND OF THE INVENTION

It is necessary to save power in portable devices and devices which are not permanently connected to a power supply in order to increase the service life. This also applies to chip cards which are used, for example, in mobile telephones. It is likewise necessary to save power in contactless chip cards which are supplied with power via an electromagnetic field provided by a so-called chip card reader. Since the field strength is standardized on the basis of any possible interactions with adjacent devices, the current which can be obtained from the field for the chip card is also limited.

The increasing miniaturization of integrated circuits which are also used in chip cards is associated with leakage currents which cannot be ignored. This problem will be further aggravated in future as miniaturization advances.

In order to save power, provision has hitherto been made in circuits for individual functional blocks to be switched on and off as required. The functional blocks which are not immediately needed to execute the next program steps are switched off. In conventional chip structures containing a processor, a memory and, if appropriate, additional functional blocks, the operating system coordinates the operations of switching the individual functional blocks on and off.

The concept of switching off functional blocks which are not needed can also be applied to memory arrangements. Memory arrangements generally comprise a plurality of memory blocks. A memory block comprises a plurality of memory locations at which a respective data word can be stored. Each memory location is assigned a unique physical address which is used to access a memory location within a memory block for the purpose of reading and writing. The address decoder which has an input for applying an address assigns a memory location to the logical address applied, with the result that the same memory location is always written to or read from during write or read access operations with the same address applied on the input side. The corresponding data word is preferably read in and out via a second input for data words, said second input, for its part, not being important, however, for the further considerations.

In the case of previous power-saving memory arrangements which are usually in the form of random access memories, a memory controller switches the memory blocks on and off as required. The power supply for the relevant memory block is switched on before an access operation and is switched off again after the end of the access operation. The memory controller is a separate functional block which is controlled by an operating system in the same manner as the further functional blocks.

The disadvantage of the memory controller is that it requires additional power. The power consumption of a chip arrangement is therefore reduced through the use of a memory controller only when the power saving for the controlled memory arrangement is greater than the power consumption of the memory controller. This is the case only when the memory arrangement which is controlled by the memory controller is of an appropriate size. In this case, switching off a large number of memory blocks, or large memory blocks which consume a lot of power, as required offsets the power consumption of the memory controller.

Chip cards are distinguished by a relatively small memory. Memory sizes of 8 and 16 kilobytes are already regarded as being large for use in chip cards. Therefore, it is not worthwhile for chip cards to use a memory controller. This would merely lead to a higher power consumption since the power consumption of the memory controller would exceed the possible power saving of the memory arrangement.

SUMMARY OF THE INVENTION

A memory arrangement including a memory array, which has at least one memory block with a power supply device which can be activated, an address decoder, which is coupled to the at least one memory block in order to control access to the at least one memory block, and an activation device for selectively activating the power supply device of memory blocks. The address decoder is set up to interact with the activation device in such a manner that, when a memory block is accessed for the first time, the power supply device of the memory block is activated and remains activated after the access operation has ended.

BRIEF DESCRIPTION OF THE DRAWINGS

The invention is explained below using exemplary embodiments and with reference to the drawing, in which.

DETAILED DESCRIPTION OF PREFERRED EMBODIMENTS OF THE INVENTION

Figure 1:
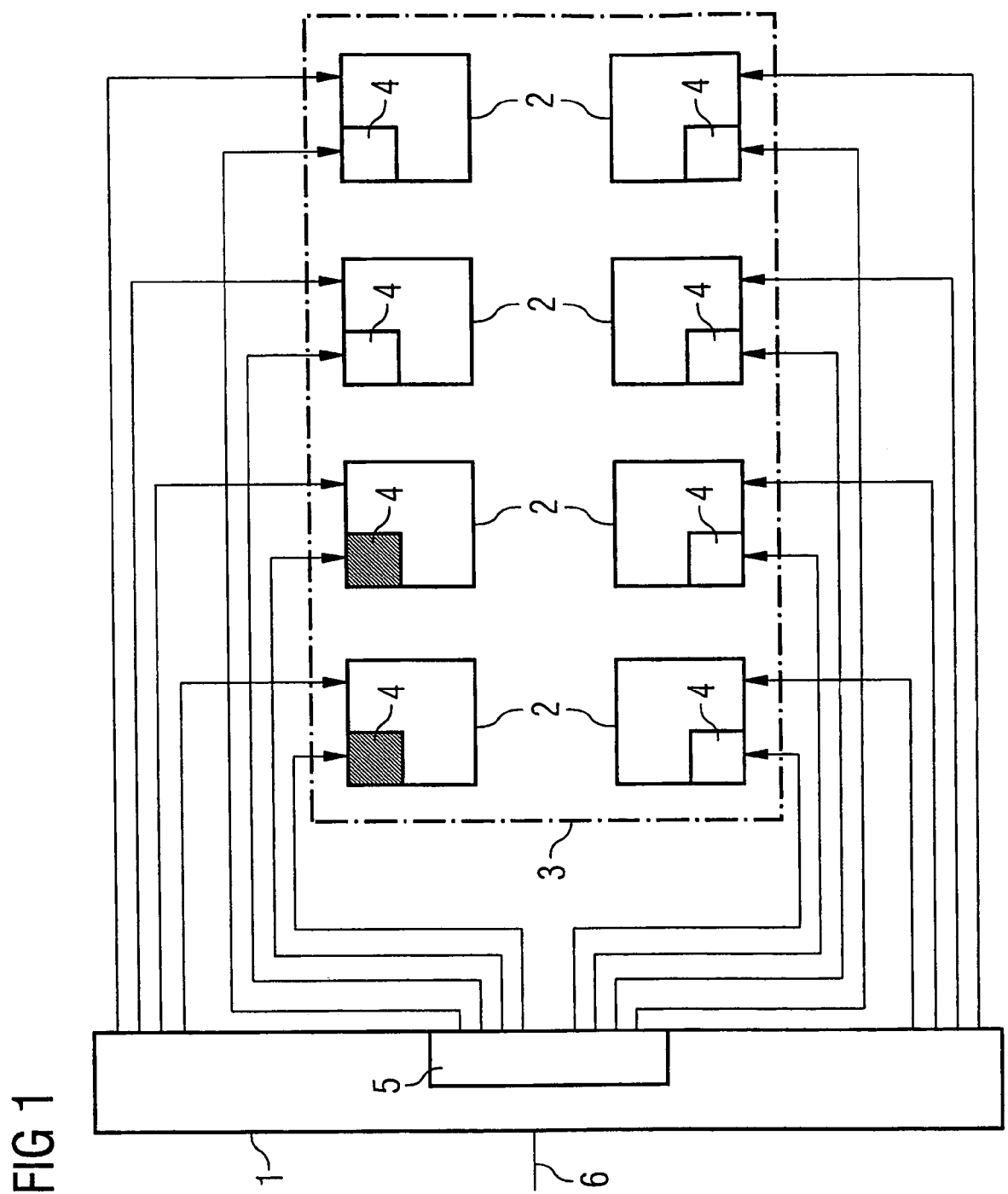
FIG. 1 shows a memory arrangement having an address decoder, which comprises an activation device.

An object of the invention is to provide a power-saving memory arrangement which is also suitable for memory arrangements having a small storage capacity. In addition, a corresponding method for operating a memory arrangement is to be specified.

The object is achieved by means of a memory arrangement of the type mentioned initially, which memory arrangement is distinguished, according to the invention, by the fact that the address decoder is set up to interact with the activation device in such a manner that, when a memory block is accessed for the first time, the power supply device of said memory block is activated and remains activated after the access operation has ended.

The advantage of this arrangement is that, in contrast to the power-consuming and complex memory controller, the address decoder which already exists has been developed. The address decoder comprises means for switching on the power supply devices of the memory blocks. This can be implemented in a simple manner in terms of circuitry. Complex monitoring as regards the end of the operation of accessing individual memory blocks is not carried out.

Since the memory blocks are activated—by switching on the power supply device—only when they are needed, the power consumption of the memory arrangement is considerably reduced if not all of the memory blocks are needed in an application.

A deactivation device is also advantageously provided in order to jointly deactivate all of the power supply devices of the memory blocks. The memory blocks which can be jointly deactivated are referred to as a memory array. All of the memory blocks can be jointly deactivated by means of simple circuitry measures.

This makes it possible to reduce the power consumption of the memory arrangement after some time in operation if all or many of the memory blocks have been switched on.

The deactivation device consequently makes it possible to initialize the memory arrangement by putting the latter into a defined starting state by jointly deactivating the memory blocks. After initialization, all of the memory blocks are deactivated but are selectively activated immediately when accessed. Alternatively, during initialization, some of the memory blocks may also be activated without being accessed.

If no memory block has been activated during initialization, the memory arrangement is operational without significantly contributing to the power consumption of the circuit. Slight delays which result and may occur when a memory block is switched on can be circumvented if the power supply for some of the memory blocks has already been activated during initialization of the memory arrangement. This is expedient if it is already known in advance which or how many memory blocks are needed. This nevertheless makes it possible to use the advantages of power saving by not all of the memory blocks being switched on.

It is likewise possible to use the deactivation device to put the memory arrangement into a power-saving mode by deactivating all of the memory blocks when the memory array is no longer needed for some time. In addition to the power saving, this power-saving mode has the advantage that the memory blocks can be activated immediately if required.

Completely switching off the memory arrangement leads to a somewhat greater power saving but is associated with time-consuming reactivation.

It is also conceivable for the memory arrangement to comprise more than one memory array each having a plurality of memory blocks and a deactivation device, thus allowing the individual memory arrays to be initialized separately.

The use of a memory arrangement according to the invention in a chip card is suitable for reducing the power consumption and, in the case of a contactless chip card, for increasing the range on account of the reduced power consumption.

The method according to the invention for operating a memory arrangement provides for a memory block in a memory array which comprises at least one memory block to be put into an active operating state, when accessed, by activating a power supply for the memory block, and for the memory block to then remain in the active operating state.

The advantages of this method are that the memory blocks are put into operation only when they are needed and they do not consume any power up to this point in time.

In the case of the method too, the memory blocks are advantageously jointly put into a quiescent state by deactivating the power supply for the memory blocks. This reduces the power consumption as a result of the memory arrangement being initialized, and the advantages of turning on (which is effected gradually) the memory blocks as required can be reused.

The memory arrangement illustrated in FIG. 1 comprises a plurality of memory blocks 2 each having a power supply device 4. These memory blocks 2 are combined to form a memory array 3. The address decoder 1 has an input 6 for applying addresses. On the output side, the address decoder 1 is connected to the memory blocks 2. The address decoder 1 furthermore has an activation unit 5 which is connected to the power supply devices 4 of the memory blocks 2.

The actual task of the address decoder 1, when an address is applied to the input 6, is to select that memory block 2 which is assigned to the address and to enable it to be accessed by writing a data word to, or reading a data word from, the corresponding memory location of the selected memory block 2.

The activation unit 5 contained in the address decoder 1 detects whether the memory block 2 which is to be accessed has already been activated. If the corresponding memory block 2 has not yet been activated, which means that its power supply device 4 is switched off, the activation unit 5 switches on the power supply device 4 of the corresponding memory block 2. This is illustrated in FIG. 1 by virtue of the fact that some of the power supply devices 4 are shown in black and others are shown in white. The two colors symbolize a power supply device 4 which is switched on and switched off, respectively. By way of example, the two power supply devices 4 which are indicated in black in FIG. 1 are used to indicate a state in which only two of the eight memory blocks 2 are being supplied with power.

No device for deactivating the memory blocks 2 is provided in the memory arrangement shown in FIG. 1. In this case, the memory blocks 2 are switched off by switching off the entire memory arrangement. This is generally the case when the circuit in which the memory arrangement is used is no longer in operation. However, it is likewise conceivable for it to be possible to switch off the entire memory arrangement within the circuit separately, with the result that access is no longer possible until the memory arrangement is switched on again.

Figure 2:
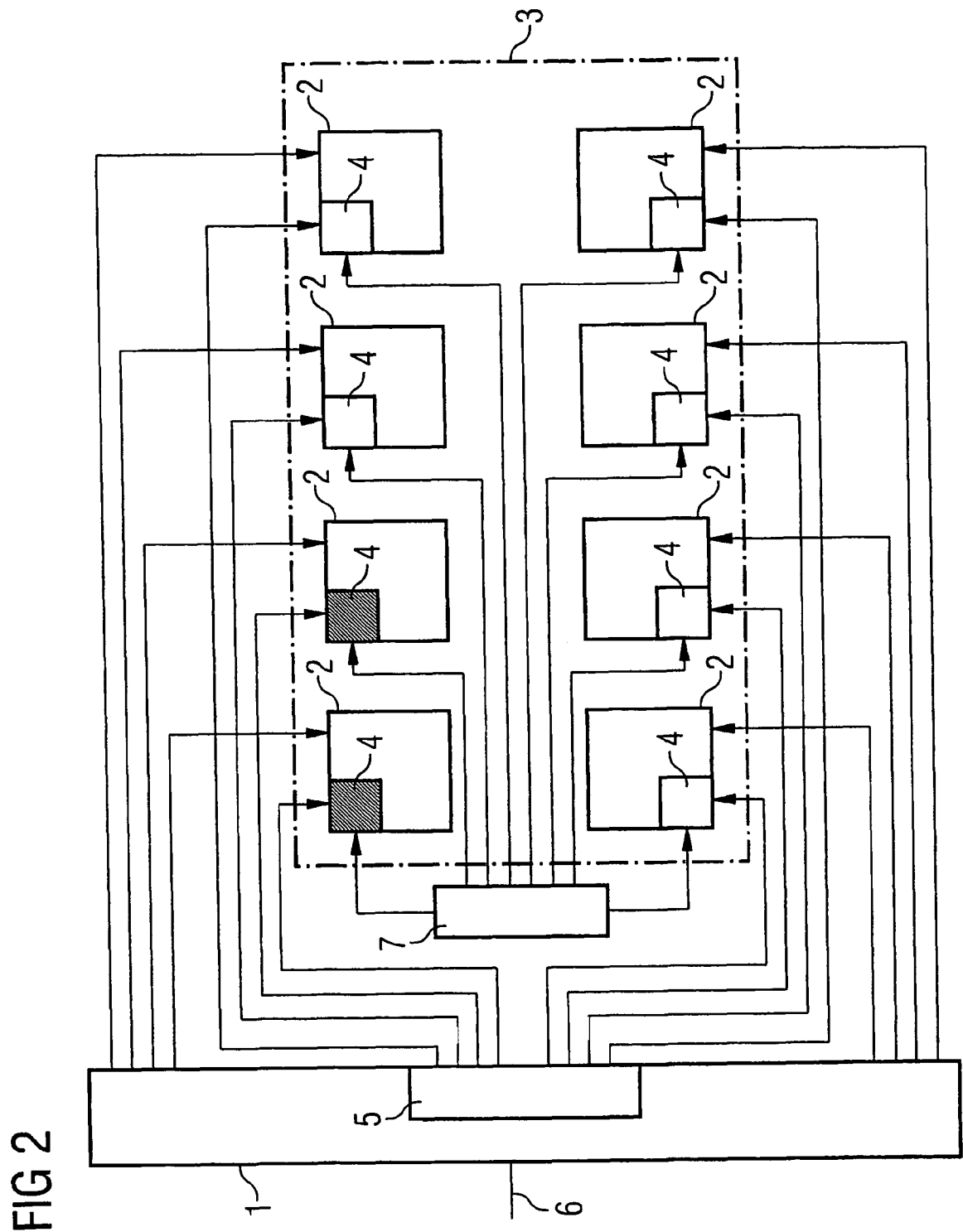
FIG. 2 shows a memory arrangement having an address decoder, which comprises an activation device and an additional deactivation device.

FIG. 2 differs from FIG. 1 by virtue of the fact that a deactivation device 7 is provided. Only the differences will be discussed below. The deactivation device 7 is connected to the power supply devices 4 of the respective memory blocks 2.

The deactivation device 7 allows all of the memory blocks of a memory array 3 to be jointly switched off.

This proves to be advantageous if the circuit arrangement has already been operated over a relatively long period of time with a multiplicity of memory blocks 2 switched on. Jointly switching off the memory blocks ensures that, after this initialization, only the memory blocks 2 which are needed are put into operation again, with the result that this measure reduces the power consumption.

Providing the deactivation unit 7 means that the circuit arrangement no longer has just the normal operating state and the possibility of switching off the entire circuit but rather it is likewise possible, as a result of initialization, to put the circuit arrangement into a power-saving mode in which it is fully operational with access (which is possible at any time) to the memory blocks 2 but consumes little power in the process since all or virtually all of the memory blocks 2 are switched off.

Of course, it is also possible to integrate the deactivation device 7 in the address decoder 1.

It shall be noted that the power supply device 4 of a memory block 2 does not only describe a complex, independent power supply but encompasses any device which makes it possible to supply power to a memory block 2, for example also a switch which connects a supply line within the memory block to a supply voltage potential.

What is claimed is:

1. A memory arrangement comprising:
   a memory array, which comprises at least one memory block having a power supply device which can be activated;
   an address decoder, which is coupled to the at least one memory block in order to control access to the at least one memory block; and
   an activation device for selectively activating the power supply device of memory blocks,
   wherein the address decoder is set up to interact with the activation device in such a manner that, when a memory block is accessed for the first time, the power supply device of said memory block is activated and remains fully activated after the access operation has ended.

2. The memory arrangement as claimed in claim 1, wherein the address decoder is set up such that different memory blocks are accessed when different address areas are addressed.

3. The memory arrangement as claimed in claim 1, further comprising a deactivation device set up to jointly deactivate all of the power supply devices of the memory array.

4. The memory arrangement as claimed in claim 1, further comprising a deactivation device set up to jointly deactivate some of the power supply devices of the memory array.

5. The memory arrangement as claimed in claim 1, which is in the form of a dynamic and/or static random access memory.

6. The use of the memory arrangement as claimed in claim 1 in a contactless chip card.

7. A memory arrangement comprising:
   a memory array, which comprises at least one memory block having a power supply device which can be activated;
   an address decoder, which is coupled to the at least one memory block in order to control access to the at least one memory block; and
   an activation means for selectively activating the power supply device of memory blocks,
   wherein the address decoder is set up to interact with the activation means in such a manner that, when a memory block is accessed for the first time, the power supply device of said memory block is activated and remains fully activated after the access operation has ended.

* * * * *